United States Patent [19]

Chen et al.

[11] Patent Number: 5,681,662
[45] Date of Patent: Oct. 28, 1997

[54] COPPER ALLOY FOILS FOR FLEXIBLE CIRCUITS

[75] Inventors: Szuchain Chen, Orange; Ronald N. Caron, Branford; James A. Scheuneman, Cheshire; Harvey P. Cheskis, North Haven; Richard J. Slusar, Wallingford, all of Conn.

[73] Assignee: Olin Corporation, New Haven, Conn.

[21] Appl. No.: 529,265

[22] Filed: Sep. 15, 1995

[51] Int. Cl.$^6$ .................... B32B 15/08; B32B 15/20; H05K 1/09
[52] U.S. Cl. .................... 428/607; 428/612; 428/626; 428/461; 174/254; 174/256
[58] Field of Search .................... 428/626, 666, 428/607, 658, 674, 676, 461, 462, 612, 687; 174/256, 254

[56] References Cited

U.S. PATENT DOCUMENTS

| | | | |
|---|---|---|---|
| 1,750,092 | 3/1930 | Crawford et al. | 205/256 |
| 3,247,082 | 4/1966 | Rose | 205/176 |
| 3,677,828 | 7/1972 | Caule | 148/6.15 R |
| 3,857,683 | 12/1974 | Castonguay | 29/195 |
| 4,441,118 | 4/1984 | Fister et al. | 357/70 |
| 4,468,293 | 8/1984 | Polan et al. | 204/27 |
| 4,515,671 | 5/1985 | Polan et al. | 204/228 |
| 4,549,941 | 10/1985 | Parthasarathi et al. | 204/27 |
| 4,552,627 | 11/1985 | Parthasarathi | 204/27 |
| 4,568,431 | 2/1986 | Polan et al. | 204/13 |
| 4,594,221 | 6/1986 | Caron et al. | 420/485 |
| 4,647,315 | 3/1987 | Parthasarathi et al. | 148/6.16 |
| 4,756,795 | 7/1988 | Bakos et al. | 156/645 |
| 4,789,438 | 12/1988 | Polan | 204/13 |
| 4,822,693 | 4/1989 | Ashok et al. | 428/614 |
| 4,888,574 | 12/1989 | Rice et al. | 338/309 |
| 4,908,275 | 3/1990 | Tsuji et al. | 428/457 |
| 4,997,517 | 3/1991 | Parthasarthi | 156/630 |
| 5,019,222 | 5/1991 | Hino et al. | 204/27 |
| 5,114,543 | 5/1992 | Kajiwara et al. | 205/152 |
| 5,145,553 | 9/1992 | Albrechta et al. | 156/640 |
| 5,230,932 | 7/1993 | Chen et al. | 428/607 |
| 5,306,465 | 4/1994 | Caron et al. | 420/492 |
| 5,424,030 | 6/1995 | Takahashi | 420/473 |

OTHER PUBLICATIONS

Electrodeposition of Alloys, Principles and Practice, by Abner Brenner (National Bureau of Standards, Washington D.C. vol. 1 (1963) appearing at pp. 558–562. no month.

The Institute for Interconnecting and Packaging Electronic Circuits, 7380 N. Lincoln Ave., Lincolnwood, IL 60646-1705. IPC–TM–650 Test Methods Manual, 2.4.2.1 Flexural Fatigue and Ductility, Foil. (Mar. 1991).

1982 Annual Book of ASTM Standards, Part 20. Standard Test Method for Folding Endurance of Paper by the M.I.T. Tester, appearing at pp. 409–411, no month.

Primary Examiner—John Zimmerman
Attorney, Agent, or Firm—Gregory S. Rosenblatt; Wiggin & Dana

[57] ABSTRACT

A flexible circuit to interconnect two components of an electrical device is formed with a flexible polymeric substrate. A copper alloy is laminated to the flexible substrate. This copper alloy is processed to have relatively high strength, an ultimate tensile strength in excess of about 80 ksi, by either alloying additions, by processing or by a combination of the two. When such an alloy is laminated to the polymeric substrate, the resultant flexible circuit has improved (more cycles to failure) dynamic fatigue performance when compared to both pure copper and dilute copper alloys.

23 Claims, 7 Drawing Sheets

COPPER ALLOY FOILS FOR FLEXIBLE CIRCUITS

BACKGROUND OF THE INVENTION

1. Field of the Invention

This invention relates to copper alloys for use in flexible circuits. More particularly, increasing the strength of a copper alloy increases the number of cyclical flexes the circuit withstands before fracture.

2. Description of the Related Art

Flexible circuits are used in electrical devices having moving parts. For example, a flexible circuit electrically interconnects a print head to a control panel in a computer printer. Flexible circuits are also used to electrically interconnect moving parts in an automobile such as the circuitry that activates airbags.

One flexible circuit has a thin polymer substrate, such as 0.001 inch thick polyimide. Copper foil is laminated to the substrate and then etched into circuitry. Usually the circuitry is in the form of parallel, longitudinal running strips. These copper foil strips extend beyond the transverse edges of the substrate and are soldered to electrical components.

As the electrical components move during service, the laminated copper strips are flexed. Periodic flexing fatigues the copper strips eventually causing the strip to fracture.

Circuit flexing is classified into three categories:

Stage 1—static, the circuit is flexed one or two times during installation.

Stage 2—semi-dynamic, the circuit undergoes between 5 and 1000 cycles during device lifetime.

Stage 3—dynamic, the circuit undergoes between 1000 and in excess of 1 million cycles during device lifetime.

A stage 1 flexible circuit is a tape automated bonding (TAB) circuit as disclosed in U.S. Pat. No. 4,908,275 to Tsuji et al. In a TAB circuit, copper circuit traces are formed on a polymer, typically polyimide, substrate. Inner leads of the circuit traces extend in cantilever fashion into a window formed in a central portion of the substrate. These inner lead ends are bonded to an integrated circuit device. Opposing outer lead portions extend beyond the polymer substrate and are soldered to a printed circuit board or other circuit.

The inner leads and the outer leads are bent approximately once each. The inner leads are bent during bonding to the integrated circuit device and the outer leads during soldering to an external circuit.

For stage 1 TAB applications, the copper requires high ductility and high electrical conductivity. The alloying additions to the copper of the alloys disclosed in the Tsuji et al. patent total, by weight, from 0.005%–1.5%.

High ductility, copper alloys, while effective for stage 1 and possibly stage 2 applications, fail in certain stage 3 applications where extremely high flex cycles are required. There exists, therefore, a need for flexible circuits having copper alloys suitable for stage 3 applications.

SUMMARY OF THE INVENTION

Accordingly, it is object of the invention to provide a flexible circuit having improved stage 3 performance. It is a feature of the invention that a class of copper based alloys may be laminated to a flexible polymeric substrate to achieve satisfactory stage 3 operation. It is a common feature of these alloys that the alloys generally have lower ductility and higher strength than copper alloy C110.

Among the advantages of the invention are that the flexible circuits manufactured utilizing the alloys of the invention may be flexed thousands to millions of times prior to failure. The electrical devices utilizing the flexible circuits will have an extended operating life.

In accordance with the invention, there is provided a flexible circuit. The circuit has a polymer substrate with two parallel running longitudinal sides interconnected by two transverse sides. A plurality of conductive copper alloy strips are laminated to the polymer substrate. These copper alloy strips run generally parallel to the longitudinal sides of the polymer substrate and extend beyond both of the transverse sides of the substrate. The composition of the copper alloy is effective to reduce fracture when compared to copper alloy C110 when the distance between the transverse side is repetitively varied.

The above stated objects, features and advantages will become more apparent from the specification and drawings that follow.

DETAILED DESCRIPTION

Figure 1:
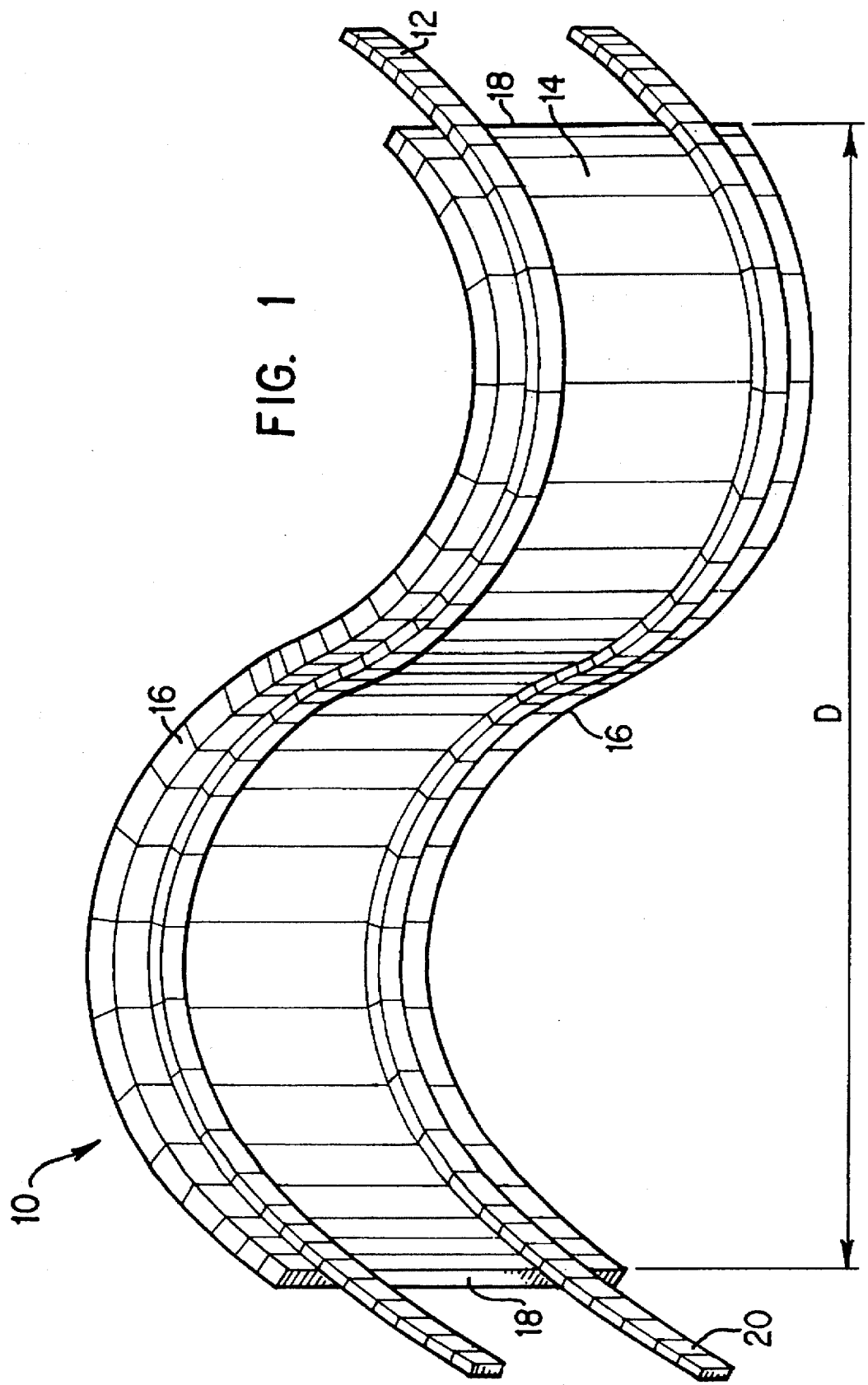
FIG. 1 is a perspective of a flexible circuit.

FIG. 1 illustrates a flexible circuit 10 having a plurality of copper alloy strips 12. The copper alloy strips 12 are laminated to a polymer substrate 14 that is formed from any suitable flexible dielectric material such as polyimide or polyester.

The polymer substrate 14 has two opposing parallel running longitudinal sides 16 interconnected by two transverse sides 18.

The copper strips 12 are laminated to the polymer substrate 14 such as by either a combination of heat and pressure using an acrylic or epoxy adhesive or by casting a polymer onto a copper alloy foil. The copper strips 12 have extensions 20 that extend beyond both transverse sides 18. The extensions 20 are soldered to electrical components such as a printer head or a printed circuit board. Frequently, one or both of the electrical components move and the distance, "D", between the two transverse sides 18 is repetitively varied. For example, if the extensions 20 are soldered to a printer head, as the head moves about the paper, the distance changes.

Figure 2:
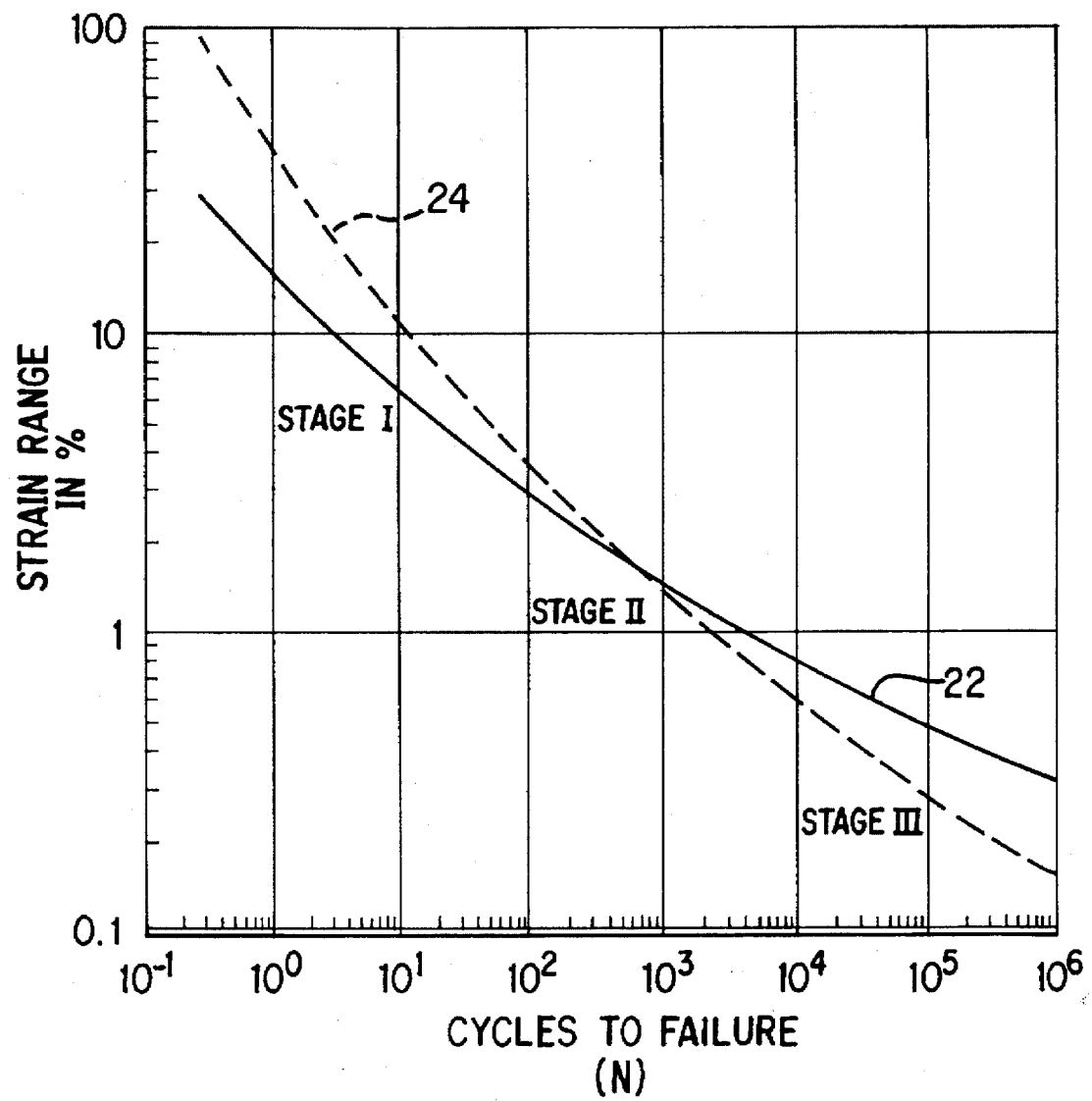
FIG. 2 graphically illustrates the cyclical failure characteristics of two types of copper alloys.

FIG. 2 graphically illustrates the relationship between the number of cycles to failure at various strain ranges for the alloys utilized in the invention (reference line 22) and comparative alloys (reference line 24). Reference line 22 illustrates that copper alloys having moderate ductility, an average elastic modulus, at room temperature, in the range of about $18\times10^6$ psi to about $25\times10^6$ psi and high strength, and an ultimate tensile strength (UTS) in excess of 80 ksi have superior performance when compared to other copper alloys.

As illustrated by reference line 24, more dilute copper alloys having higher ductility and lower strength are superior for stage 1 applications and equivalent for stage 2 applications, but less satisfactory for stage 3 applications.

The alloys of the invention generally include in excess of 1.5% by weight alloying additions and preferably include in excess of 2% by weight alloying additions. Any alloying additions that increase strength without imparting excessive brittleness may be employed. Preferred additions include transition metals such as iron, nickel and cobalt.

The transition metal should be present in an amount of from about 0.5% by weight to about 6% by weight and preferably in an amount of from about 2% to about 5% by weight. Among the preferred alloys for are:

Copper alloy C7025 having the composition, by weight, 2%–4.8% nickel, 0.2%–1.4% silicon, 0.05%–0.45% magnesium and the balance copper;

Copper alloy C71500 having the composition, by weight, of 29%–33% nickel and the balance copper; and A copper alloy containing from an effective amount to increase strength up to 1% chromium, 0.05%–0.40% zirconium, from 0.1% to about 1.0% by weight of a transition metal, from 0.05% to 0.7% titanium and the balance copper with an atomic ratio of transition metal to titanium, M:Ti of from about 1.2:1 to about 7.0:1 is disclosed in U.S. Pat. No. 5,306,465 to Caron et al.

For use as a flexible foil, the copper alloy has a thickness of from about 0.0003 inch to about 0.004 inch. Preferably the foil has a thickness of from about 0.00065 inch to about 0.0015 inch. The foil should be wrought, rolled to gage from a cast ingot of the desired composition and heat treated to a desired temper.

To improve adhesion to the polymer substrate, the foil is treated with an adhesion enhancing compound, such as electrolytically deposited copper dendrites, as disclosed in U.S. Pat. No. 4,468,293 to Polan et al. or with an electrolytically co-deposited layer of chromium and zinc as disclosed in U.S. Pat. No. 5,230,932 to Chen et al. Other adhesion enhancing processes include electrolytically deposited nodules of a copper-nickel alloy as disclosed in U.S. patent application Ser. No. 08/184,534 (now abandoned) by Chen et al. that was filed on Jan. 21, 1994 and a chromium phosphate coating as disclosed in U.S. Pat. Nos. 3,677,828 to Caule and 4,647,315 to Parthasarathi et al.

All of the foil treating patents and patent application in the preceding paragraph are incorporated by reference in the entirety herein.

Referring back to FIG. 1, the lamination of the copper strips 18 to the polymer substrate 14 is accomplished through the use of a polymer adhesive, such as an acrylic, heat (a temperature in the range of 180° C. to 200° C.) and pressure (200 psi to 300 psi).

Delamination, separation of the copper strips from the polymeric substrate, is a cause of failure in flexible circuits. We have found that the alloys of the invention have a peel strength, force required for delamination, of approximately twice that of the more dilute copper alloys of the prior art.

Still another advantage of using the higher strength materials is that both before and after the lamination cure cycle, the material is more resistant to creasing, denting and transit damage.

The advantages of the present invention will become more apparent from the examples that follow.

EXAMPLE 1

Cu-W7, copper alloy C110 (electrolytic tough pitch copper having a nominal composition by weight of 99.90% copper and a maximum of 0.05% oxygen).

Cu-E2-electrolytically formed copper foil having a nominal composition of 99.9% (minimum, by weight) of copper.

Copper alloy C197 (nominal composition by weight 0.6% iron, 0.2% phosphorous, 0.05% magnesium and the balance copper).

Copper alloy C7025.

To evaluate stage 1 static performance, unlaminated foil was treated by heating to 180° C. for 3 hours in a forming gas (96% nitrogen, 4% hydrogen). The treated foils were tested using standard industry test equipment. Stage 1 flex performance was evaluated in accordance with ASTM (American Society for Testing and Materials) method D2176-69. In accordance with this method, the foil is flexed through an angle of 135°±2° to the right and to the left of the position of the unfolded foil. The folds are about two folding surface mandrels having a specified radius.

Figure 3:
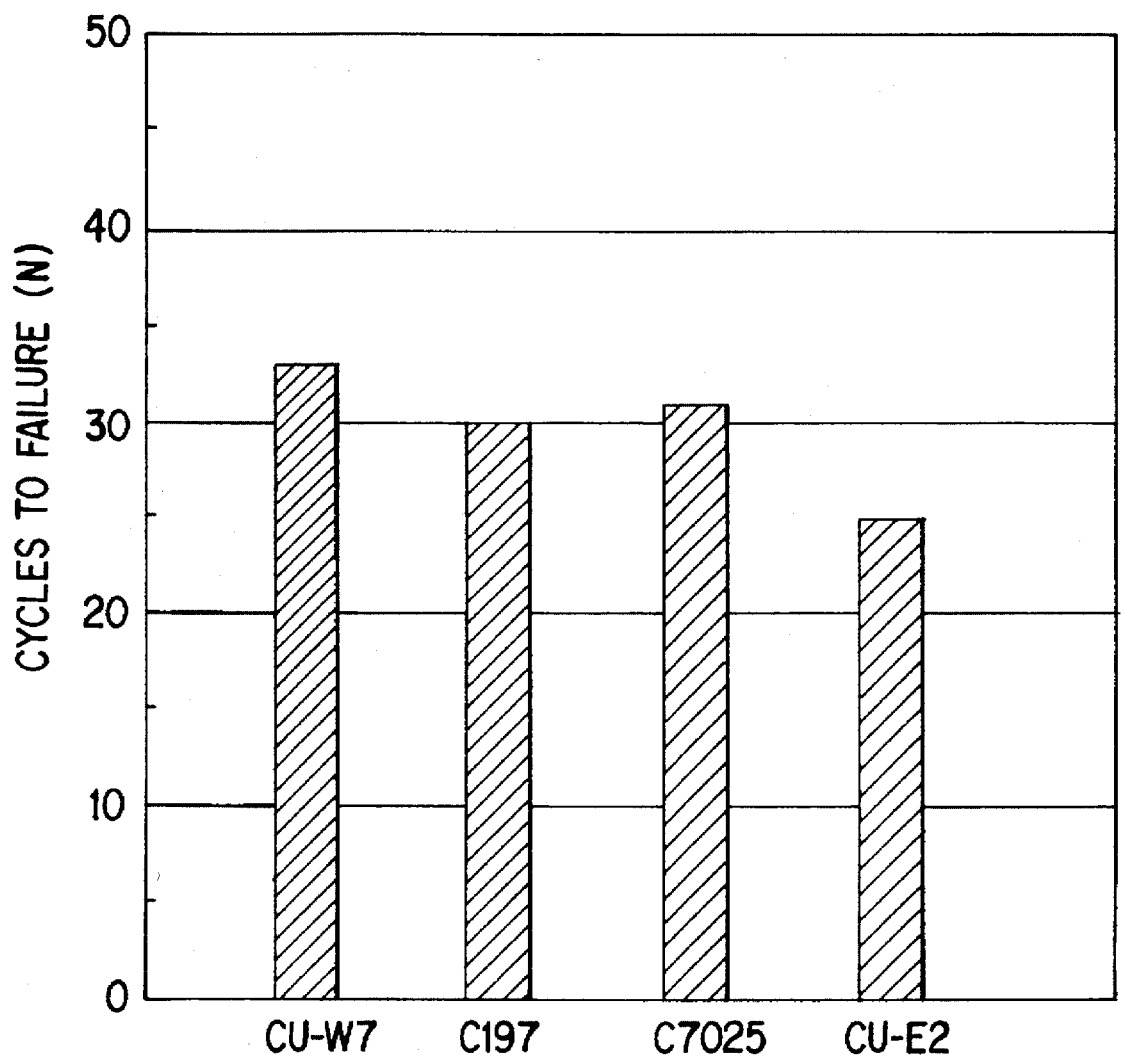
FIG. 3 identifies the cycles to failure of various copper alloys subjected to a simulated stage 1 application.

The samples were repetitively bent around a mandrel having a 0.38 millimeter radius and the number of cycles to fracture recorded. As illustrated in FIG. 3, a high strength alloy in accordance with the invention had performance approximately equivalent to that of the essentially pure copper (CU-W7 and CU-E2) and dilute copper alloys (C197).

Figure 4:
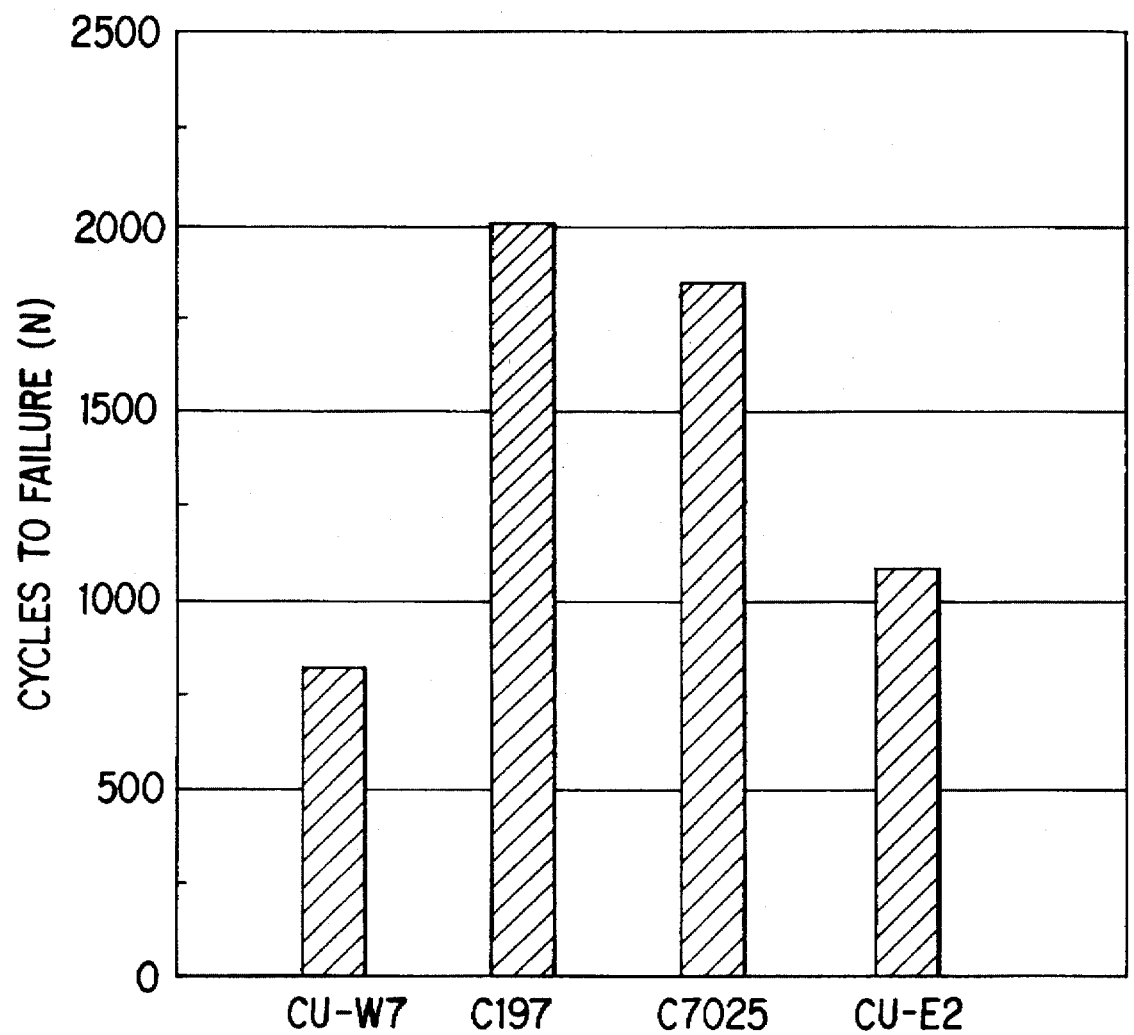
FIG. 4 graphically illustrates the cycles to failure for various copper alloys subjected to a simulated stage 2 operation.

Semi-dynamic, stage 2, flex performance was evaluated in accordance with ASTM method, D2176-69. Unlaminated foil samples were treated as above and the samples then repetitively bent around a mandrel having a 2.0 mm radius. As illustrated in FIG. 4, the high strength alloy utilized in the invention has a performance approximately equivalent to that of a dilute copper alloy and significantly improved performance to that of relatively pure copper.

Figure 5:
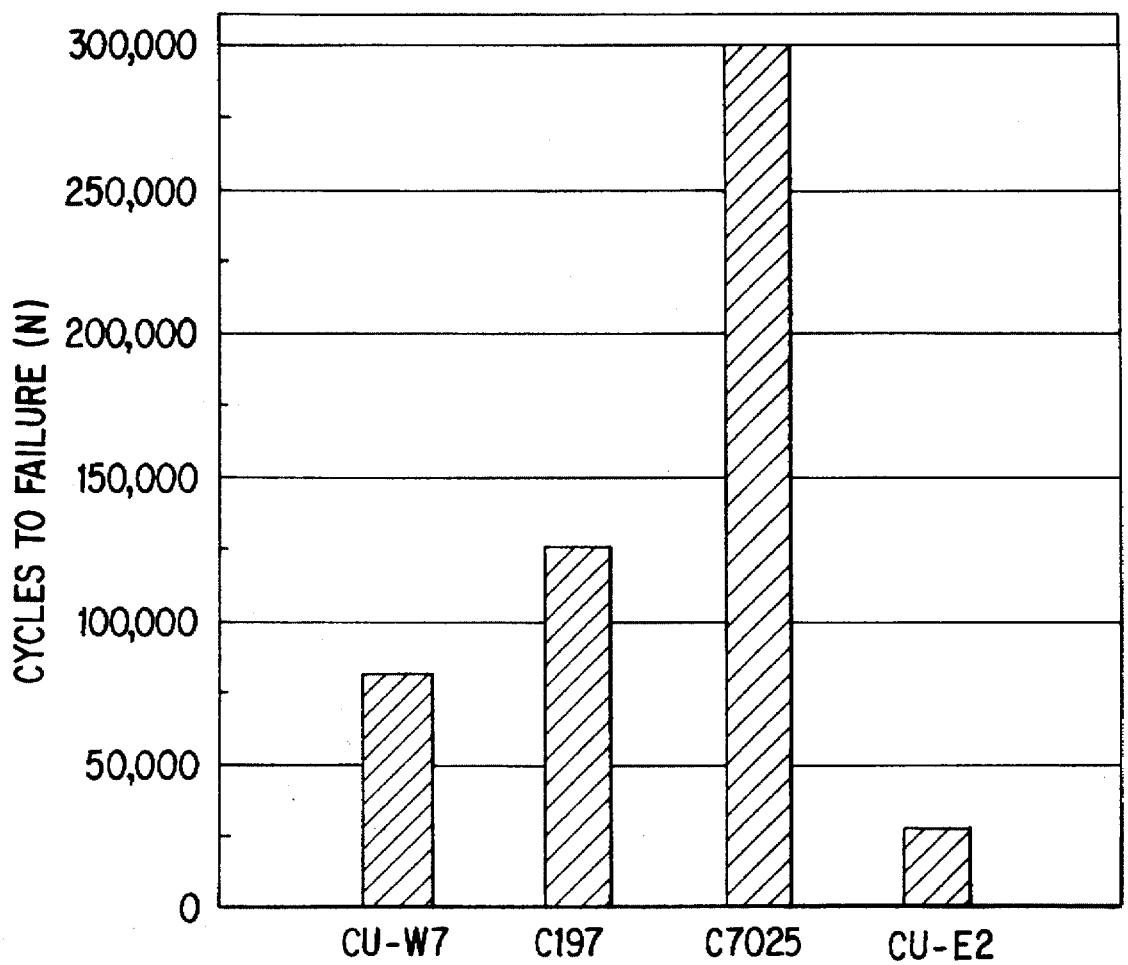
FIG. 5 graphically illustrates the cycles to failure for various copper alloys subjected to a simulated stage 3 operation.

Dynamic, stage 3, flex performance was evaluated utilizing a fatigue ductility test in accordance with IPC (The Institute for Interconnecting and Packaging Electronic Circuits) method, IPC-TM-650, §2.4.2.1. In accordance with the method, the foil is pulled between a series of support rollers about a mandrel of a specified radius. The unlaminated foil samples were treated as above. As illustrated in FIG. 5, the high strength copper alloy utilized in the invention had an excess of two fold improvement over dilute copper alloys and between a 3 and 6 fold improvement over pure copper.

EXAMPLE 2

Figure 6:
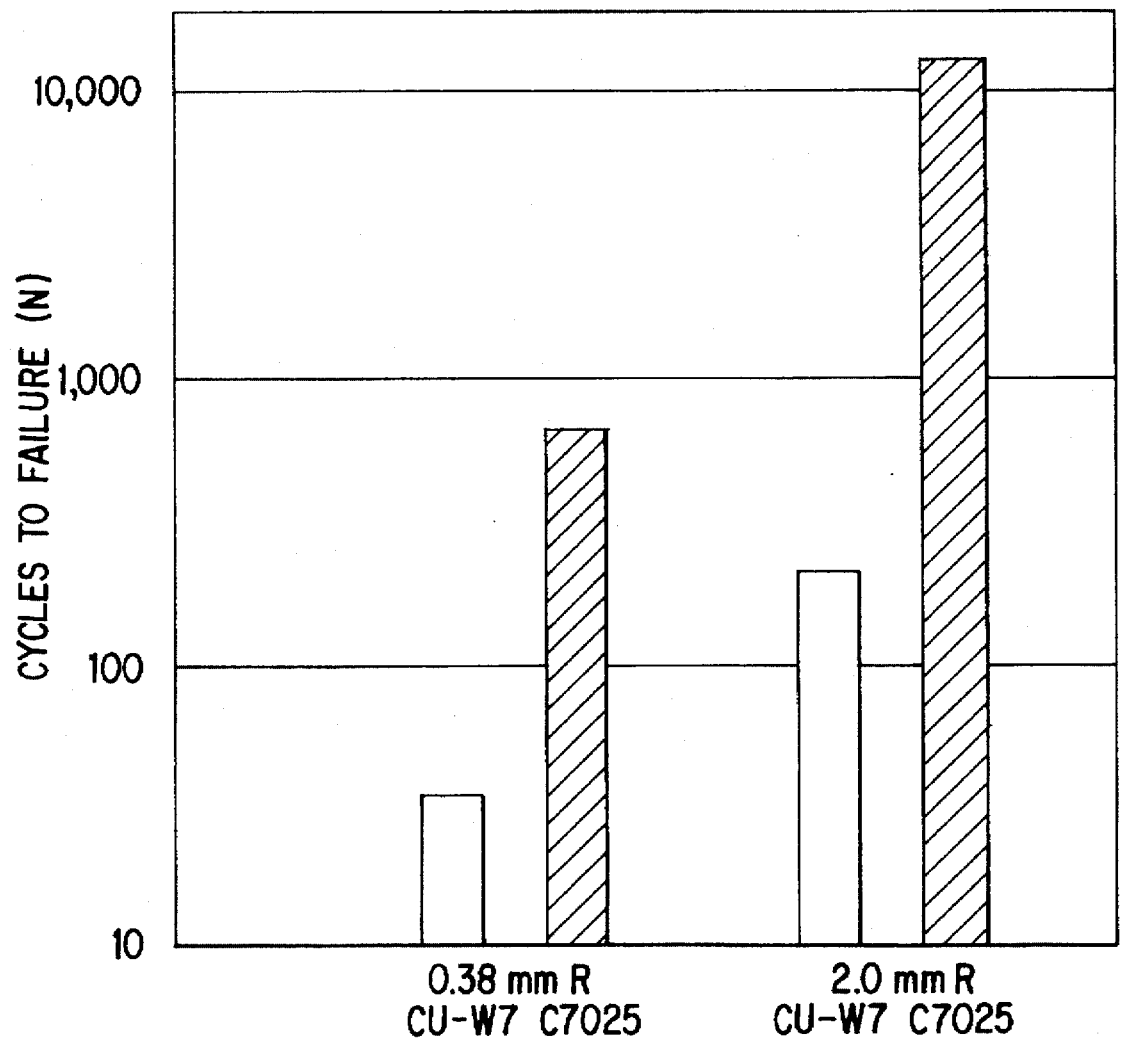
FIGS. 6 graphically illustrates the effect of thickness on the number of cycles to failure of various copper alloys.
Figure 7:
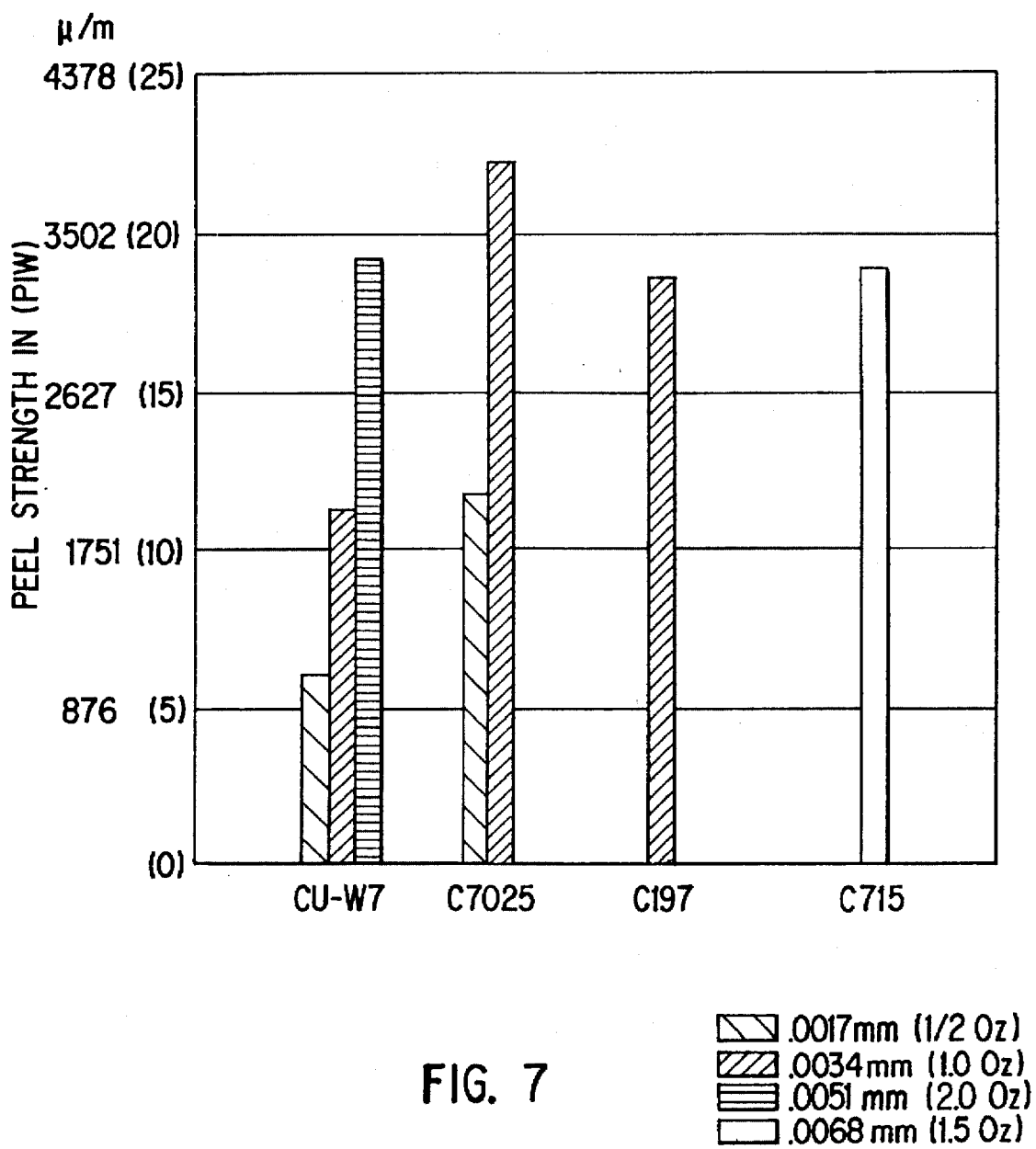
FIGS. 7 graphically illustrates the effect of alloy selection on peel strength.

The performance of one-half ounce (0.00067 inch) copper alloy foil was evaluated in accordance with ASTM Method D2176-69. Unlaminated one-half ounce copper foil strips were as in Example 1. As illustrated in FIG. 6, in stage 1 performance, the copper alloy of the invention had approximately a 15 fold improvement in the number of cycles to failure when compared to pure copper. In stage 2 operation, the improvement was almost 100 fold.

By comparing FIG. 6 with FIGS. 3 and 4, it is seen that superior stage 1 and stage 2 results are obtained with one-half ounce copper alloy foil as compared to one ounce copper foil.

EXAMPLE 3

Copper strips were laminated to a thicker copper substrate (0.040 inch thick) by an acrylic adhesive. The peel strength was then evaluated by peeling the foil from the substrate at a 90° angle and measuring the force required in pounds per inch of width (PIW). The copper alloys utilized in the flexible circuits of the invention have superior peel strength to both dilute copper alloys and to pure copper.

EXAMPLE 4

A series of copper alloys were exposed to various thermal profiles that the copper strip may be exposed to during lamination or use. The copper alloys of the invention have improved thermal stability, identified by minimal or no change in mechanical properties when comparing before and after the thermal exposure, as illustrated in Table 1.

TABLE 1

| Alloy | UTS ksi | Elongation | Thermal Stability after Exposure | |
|---|---|---|---|---|
| | | | 180° C./3 hrs | 350° C./1 hr |
| CU-W7 | 30 | 17 | Y | Y |
| CU-W5 | 65 | 2 | N | N |
| CU-E2 | 45 | 9 | Y | N |
| C197 | 75 | 5 | Y | Y |
| C7025 | 105 | 3 | Y | Y |
| C715 (AR) | 95 | 1 | Y | Y |

The copper flexible circuits of the invention utilizing the copper strips with higher strength and softening resistance permit the use of the circuit traces themselves as the jack in an electrical connection. This simplifies assembly and decreases the cost of electrical components. In addition, the preferred alloys such as C7025 are solderable.

While the higher strength of the alloys utilized in the invention was disclosed as being the result of alloying additions, these higher strengths can also be the result of alloy processing. Some copper alloys can be cold worked, such as by rolling, to achieve the ultimate tensile strength required for satisfactory stage 3 operation. Other copper alloys can be heat treated for precipitation hardening and softening resistance.

While described in terms of single copper layer flex circuits, the invention is equally applicable to multi-layer flex circuitry.

It is apparent that there has been provided in accordance with the present invention a flexible circuit that fully satisfies the objects, means and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A foil with improved stage 3 flex performance, comprising:
   a copper alloy strip having a thickness of from about 0.0003 inch to about 0.004 inch and the combination of a room temperature average elastic modulus of from $18 \times 10^6$ psi to $25 \times 10^6$ psi, a room temperature ultimate tensile strength in excess of 80 ksi and in excess of 1.5%, by weight, of alloy additions; and
   an adhesion enhancing layer coating said copper alloy strip.

2. The foil of claim 1 wherein said adhesion enhancing strip is selected from the group consisting of copper dendrites, co-deposited chromium and zinc, copper-nickel alloy nodules and chromium phosphate.

3. The foil of claim 2 wherein said copper alloy contains in from 0.5%, by weight, to 6%, by weight, of a transition metal selected from the group consisting of iron, nickel, cobalt and mixtures thereof.

4. The foil of claim 3 wherein said copper alloy contains from about 2%, by weight, to about 5%, by weight, of a transition metal.

5. The foil of claim 4 wherein said coating layer is copper dendrites.

6. A flexible circuit, comprising:
   a polymer substrate having two parallel running longitudinal sides interconnected by two transverse sides; and
   a plurality of conductive copper alloy strips laminated to said polymer substrate running generally parallel to said longitudinal sides and extending beyond both of said two transverse sides, wherein said copper alloy strips have a room temperature average elastic modulus of from $18 \times 10^6$ psi to $25 \times 10^6$ psi and reduced fracture as compared to copper alloy C110 strips when the distance between said transverse sides is repetitively varied.

7. The flexible circuit of claim 6 wherein said copper alloy strips have a room temperature ultimate tensile strength in excess of 80 ksi.

8. The flexible circuit of claim 7 wherein said copper alloy contains in excess of 1.5%, by weight, of alloy additions.

9. The flexible circuit of claim 8 wherein said copper alloy contains in from 0.5%, by weight, to 6%, by weight, of a transition metal selected from the group consisting of iron, nickel, cobalt and mixtures thereof.

10. The flexible circuit of claim 9 wherein said copper alloy contains from about 2%, by weight to about 5%, by weight, of a transition metal.

11. The flexible circuit of claim 8 wherein an adhesion enhancing layer is disposed between polymer substrate and said copper alloy strips.

12. The flexible circuit of claim 11 wherein said adhesion enhancing layer is copper dendrites.

13. The electrical apparatus of claim 8 wherein said copper alloy has the composition, by weight, of 29%–33% nickel and the balance copper.

14. The electrical apparatus of claim 8 wherein said copper alloy has the composition, by weight, of 2%–4.8% nickel, 0.2%–1.4% silicon, 0.05%–0.45% magnesium and the balance copper.

15. An electrical apparatus designed for stage 3 operation, comprising:
   a first component;
   a second component; and
   a flexible circuit interconnecting said first and second components wherein said flexible circuit comprises a polymer substrate having two parallel running longitudinal sides interconnected by two transverse sides and a plurality of conductive copper alloy strips laminated to said polymer substrate running generally parallel to said longitudinal sides and extending beyond both of said two transverse sides wherein said copper alloy strips have a room temperature average elastic modulus of from $18 \times 10^6$ psi to $25 \times 10^6$ psi and reduced fracture as compared to copper alloy C110 strips when said device undergoes stage 3 operation.

16. The electrical apparatus of claim 15 wherein said copper alloy strips have a room temperature ultimate tensile strength in excess of 80 ksi.

17. The electrical apparatus of claim 15 wherein said copper alloy contains in excess of 1.5%, by weight, of alloy additions.

18. The electrical apparatus of claim 17 wherein said copper alloy contains from 0.5%, by weight, to 6%, by weight, of a transition metal selected from the group consisting of iron, nickel, cobalt and mixtures thereof.

19. The electrical apparatus of claim 18 wherein said copper alloy contains from about 2%, by weight, to about 5%, by weight, of a transition metal.

20. The electrical apparatus of claim 17 wherein an adhesion enhancing layer is disposed between polymer substrate and said copper alloy strips.

21. The electrical apparatus of claim 20 wherein said adhesion enhancing layer is copper dendrites.

22. The electrical apparatus of claim 17 wherein said copper alloy has the composition, by weight, of 29%–33% nickel and the balance copper.

23. The electrical apparatus of claim 17 wherein said copper alloy has the composition, by weight, of 2%–4.8% nickel, 0.2%–1.4% silicon, 0.05%–0.45% magnesium and the balance copper.

* * * * *